US006417746B1

(12) United States Patent
Johnson

(10) Patent No.: US 6,417,746 B1
(45) Date of Patent: Jul. 9, 2002

(54) LONGITUDINALLY-COUPLED SAW FILTER WITH ENHANCED FREQUENCY SELECTIVITY

(75) Inventor: Robert A. Johnson, Tustin, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/545,232

(22) Filed: Apr. 7, 2000

(51) Int. Cl.[7] .................................................. H03H 9/00

(52) U.S. Cl. .................................... 333/195; 310/313 B

(58) Field of Search ................................. 333/193, 194, 333/195, 196; 310/313 R, 313 B

(56) References Cited

U.S. PATENT DOCUMENTS

| | | | | |
|---|---|---|---|---|
| 4,731,595 A | * | 3/1988 | Wright | 333/195 |
| 5,485,052 A | | 1/1996 | Seki et al. | 310/313 |
| 5,717,367 A | | 2/1998 | Murai | 333/195 |
| 5,874,869 A | | 2/1999 | Ueda et al. | 333/193 |
| 5,936,488 A | * | 8/1999 | Taguchi et al. | 333/195 |
| 6,163,236 A | * | 12/2000 | Thomas | 333/195 |

FOREIGN PATENT DOCUMENTS

| | | | | |
|---|---|---|---|---|
| JP | 11-17494 A | * | 1/1999 | H03H/9/64 |
| JP | 11-298287 A | * | 10/1999 | H03H/9/145 |

OTHER PUBLICATIONS

Rockwell brochure on *Collins Torsional Mechanical Filters*, Rockwell Semiconductor Systems—Filter Products; 2990 Airway Avenue, Costa Mesa, CA 92626–6018; Feb. 1996.

* cited by examiner

*Primary Examiner*—Robert Pascal
*Assistant Examiner*—Dean Takaoka
(74) *Attorney, Agent, or Firm*—Howrey Simon Arnold & White, LLP

(57) ABSTRACT

A multi-pole surface acoustic wave filter in which one or more reflectors are inserted in a gap between source and destination interdigital transducers. The number of reflectors which are inserted bears a relationship to the number of poles in the filter frequency response.

20 Claims, 17 Drawing Sheets

LONGITUDINALLY-COUPLED SAW FILTER WITH ENHANCED FREQUENCY SELECTIVITY

BACKGROUND OF THE INVENTION

1. Field of the Invention

This invention generally relates to surface acoustic wave (SAW) filters, and, more specifically, to enhancing the performance of SAW filters.

2. Background

A conventional longitudinally-coupled SAW filter is illustrated in FIG. 1. The filter itself is identified with numeral 10. The filter is shown as it would typically be configured in operation, i.e., terminated with source and load impedances and coupled to a signal source. The signal source is identified with numeral 1; the source impedance, with numeral 2, and the load impedance, with numeral 7. The filter itself comprises two outer reflectors, identified respectively with numerals 3 and 6, and two interdigital transducers (IDTs), identified respectively with numerals 4 and 5, situated within the cavity 9 defined by the two outer reflectors 3 and 6. IDT 4, being coupled to the signal source 1 through the source impedance 2, functions as a source IDT, and IDT 5, being coupled to the load impedance 7, functions as a load IDT. In the conventional filter, the gap 8 between the source and load IDTs 4 and 5 is typically the spacing between IDT fingers plus roughly 0.7 Bragg lengths where a Bragg length is approximately defined as ½λ (λ being the wavelength of the acoustic wave generated within the SAW filter). The Bragg length is a fixed value whereas the wavelength varies with frequency. The number of poles (natural frequencies) in the transfer function of the filter of FIG. 1 is limited to 3.

A second embodiment of the conventional SAW filter is illustrated in FIG. 2. As in FIG. 1, the filter, which is identified by numeral 19, is shown as it would typically be configured in operation, i.e., terminated with source and load impedances and coupled to a signal source. The signal source in this embodiment is identified with numeral 11; the source impedance, with numeral 12; and the load impedance, with numeral 18. The filter itself comprises two outer reflectors, identified respectively with numerals 13 and 17, with three IDTs, identified respectively with numerals 14, 15, and 16, in the cavity defined by the two outer reflectors 13 and 17. IDT 15, being coupled to signal source 11 through source impedance 12, functions a source IDT, while IDTs 14 and 16, being coupled to the load impedance 18, function as load IDTs. In this embodiment of the conventional SAW filter, the gaps 19 and 20 between the source and load IDTs are each typically the same as the first embodiment. Again, the number of poles in the transfer function of the filter of FIG. 2 is limited to 3.

As is known, each of the filters of FIGS. 1 and 2 are mounted on a piezo-electric substrate made of a material such as lithium tantalate ($LiTaO_3$), lithium niobate ($LiNbO_3$), or the like. FIGS. 1 and 2 each represent top views of the filters as they might appear on the surface of the substrate. In operation, when the A/C signal from the signal source is applied to the filter, an alternating electric field is created between the fingers of the IDTs making up the filter. This electric field causes the substrate to expand and contract at the frequency of the A/C signal applied by the signal source. The result is that a longitudinally-propagated acoustic wave is generated within the cavity defined by the outer two reflectors.

The frequency selectivity of a filter is defined by the number of poles in the transfer function of the filter. Generally speaking, the greater the number of poles, the greater the frequency selectivity of the filter. The situation is illustrated in FIG. 3, in which the frequency response of a filter with a small number of poles is identified with numeral 21, and the frequency response of a filter with a greater number of poles is identified with numeral 20. As can be seen, the frequency selectivity of the frequency response identified with numeral 20 (determined by the steepness of the slope of the sides) is greater than that of the frequency response identified with numeral 21.

As stated previously, the number of poles that is available in the filters of FIGS. 1 and 2 is three. If greater frequency selectivity is desired beyond that available through a three-pole filter, the conventional approach is to cascade one or more of the filters of FIGS. 1 and 2 in order to achieve a greater number of poles, and hence, greater frequency selectivity. The problem is that this results in excessive space being consumed by the filter, and also excessive insertion loss.

Consequently, there is a need for a SAW filter which is able to provide increased frequency selectivity while avoiding the excessive space consumed and insertion loss exhibited in the conventional approach.

SUMMARY OF THE INVENTION

In accordance with the purpose of the invention as broadly described herein, there is provided a surface acoustic wave filter comprising first and second reflectors defining a cavity, first and second interdigital transducers (IDTs) within the cavity and spaced by a gap, and at least one reflector within the gap. In one embodiment, the number of reflectors in the gap is equal to the desired number of filter poles−3. The spacing between the reflectors in the gap, and between the IDTs and the reflectors in the gap; the number of fingers in the IDTs, and in the reflectors in the gap; the pitch of the IDTs and of the reflectors in the gap; and the aperture of the IDTs and of the reflectors in the gap provide the necessary degrees of freedom to achieve a desired frequency response shape, which is determined in part by the placement of the poles and zeroes of the filter transfer function. In one implementation, one or more of these parameters are selected to achieve an optimal filter in terms of one or more of the following criteria: 1) minimum ripple in the passband; 2) maximum attenuation in the stopband; 3) minimum insertion loss; 4) minimum sensitivity to parameter changes; and 5) maximum ease of buildability.

In a second embodiment, first, second, and third IDTs are placed within the cavity. The spacing between the first and second IDTs defines a first gap, whereas the spacing between the second and third IDTs defines a second gap. In this embodiment, at least one reflector is placed in the first gap, and at least one reflector is placed in the second gap. In this implementation, the filter exhibits mirror-image symmetry, such that the number of reflectors in the first gap is equal to the number of reflectors in the second gap. In this implementation example, the number of reflectors placed in each gap is equal to the number of desired poles−3.

A surface acoustic wave filter system is also provided. In this system, an embodiment of a filter configured in accordance with the subject invention is terminated with a parallel load impedance and a series source impedance. The series source impedance is placed in series with an A/C signal source.

In one application, the filter system of the subject invention forms the RF filter of the front-end of a superheterodyne transceiver.

DETAILED DESCRIPTION OF THE PREFERRED EMBODIMENTS

Figure 4:
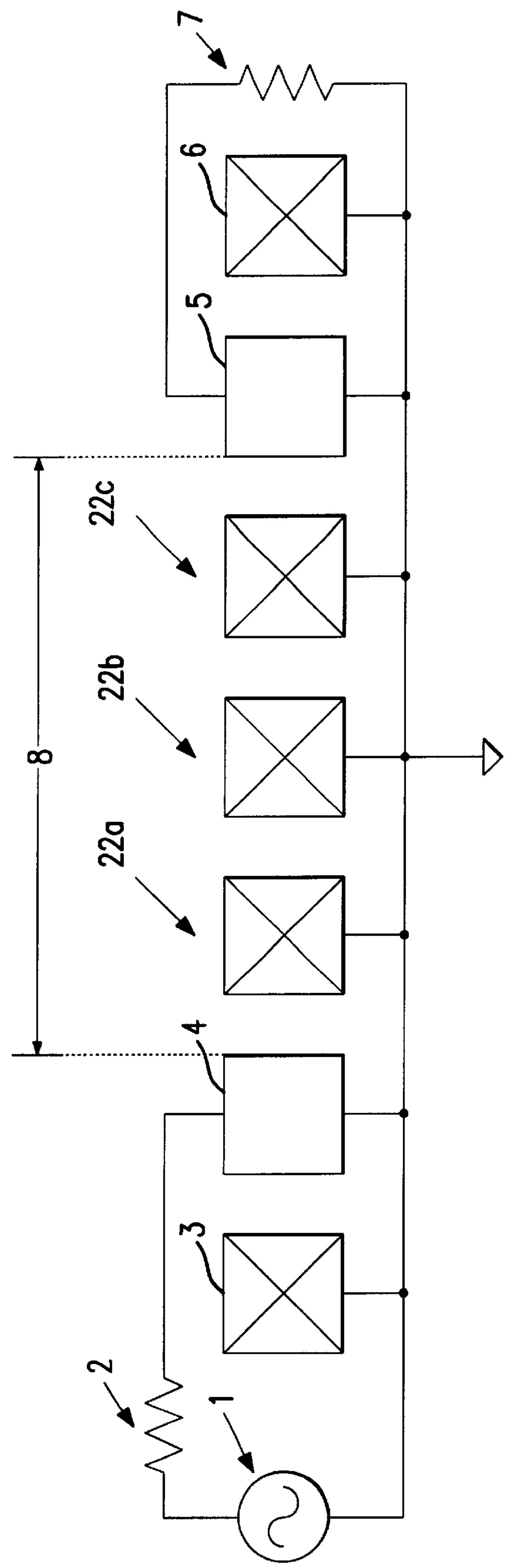
FIG. 4 illustrates a first embodiment of a filter system in accordance with the subject invention.

A first embodiment of the subject invention is illustrated in FIG. 4. Relative to FIG. 1, like elements of FIG. 4 are referenced with like identifying numerals. This embodiment involves a modification to the filter system of FIG. 1, whereby gap 8 is substantially widened, and a number of reflectors related to the number of desired filter poles is inserted in the gap. The purpose and effect of this is to allow an increase in the number poles in the transfer function of the filter system, thus enhancing the frequency selectivity of the filter.

For illustrative purposes only, three reflectors, identified respectively with numerals 22*a*, 22*b*, and 22*c*, are shown inserted in the gap 8, but it should be appreciated that the invention includes embodiments in which one, several, or a large number of reflectors may be inserted in the gap 8.

The number of reflectors inserted within the gap 8 bears a relationship to the number of desired poles, and hence frequency selectivity, of the filter system. In one implementation, the number of reflectors which should be inserted is equal to the number $N_p$ of desired poles minus 3. FIG. 4 illustrates an example in which three reflectors 22*a*, 22*b*, 22*c* have been placed within the cavity between IDTs 4 and 5, resulting in a filter system having 6 poles. Although the maximum selectivity and adequate control over the natural frequencies is realized in the case of controlling reflectors being equal to the number of desired poles minus 3, this patent is not limited to that formula. As in the case of conventional longitudinally-coupled SAW filters, the number of poles, when no controlling reflectors are used, may be two rather than three. Then the number of added reflectors will be the desired number of poles minus 2. These less selective designs are often used in narrow bandwidth applications.

Similarly, the size of the gap 8 also bears a relationship to the number of desired poles, and hence frequency selectivity, of the filter system. In one implementation, the length of the cavity defined by the outer reflectors 3 and 6 is related to the desired number of poles $N_p$ of the filter system through the following equation: $L_c=K\times(f_0/B_3)\times N_p$, where K is 0.7±0.1 depending on the specific filter design; $f_0$ is the filter center frequency and $B_3$ is the filter 3 dB bandwidth. Once the desired cavity length is known, the desired length of the gap 8 can be determined by subtracting off the lengths of the IDTs 4 and 5, the gap between reflector 3 and IDT 4, and the gap between reflector 6 and IDT 5.

Figure 1:
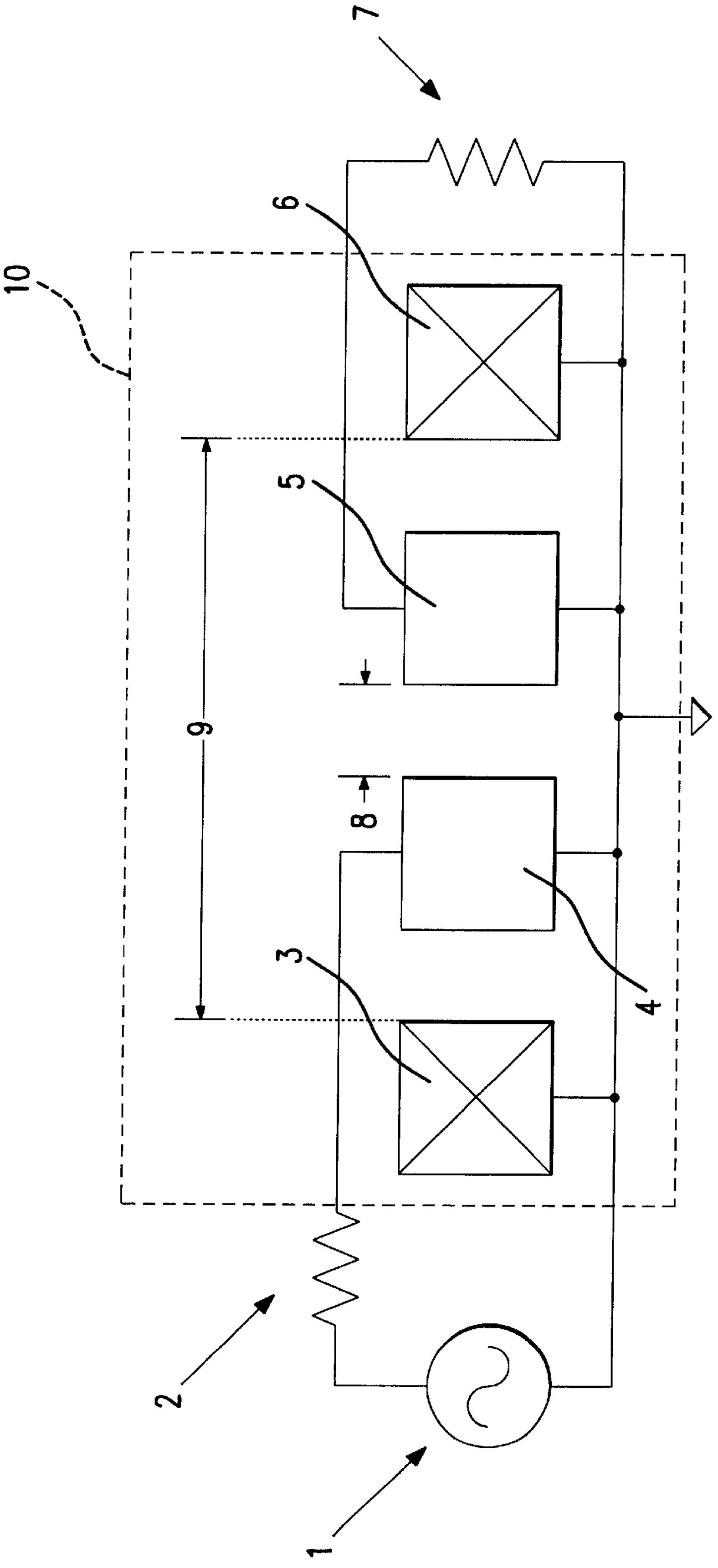
FIGS. 1 and 2 illustrate conventional SAW filter systems.

Compared to the conventional filter system of FIG. 1, the number of poles in the transfer function of the filter of FIG. 4 can be increased by increasing the number of reflectors inserted in the gap 8 between the IDTs 4 and 5. In contrast, the number of poles in the transfer function of the filter of FIG. 1 is increased by cascading multiple ones of the filter system of FIG. 1. The drawback of this approach is that, as more and more filters are cascaded with one another, the insertion loss of the overall system goes up. The result is that the frequency selectivity of the system can be increased only by increasing the insertion loss of the overall system. In contrast, in the filter system of FIG. 4, the frequency selectivity of the system can be increased with a less significant increase in insertion loss.

Figure 6:
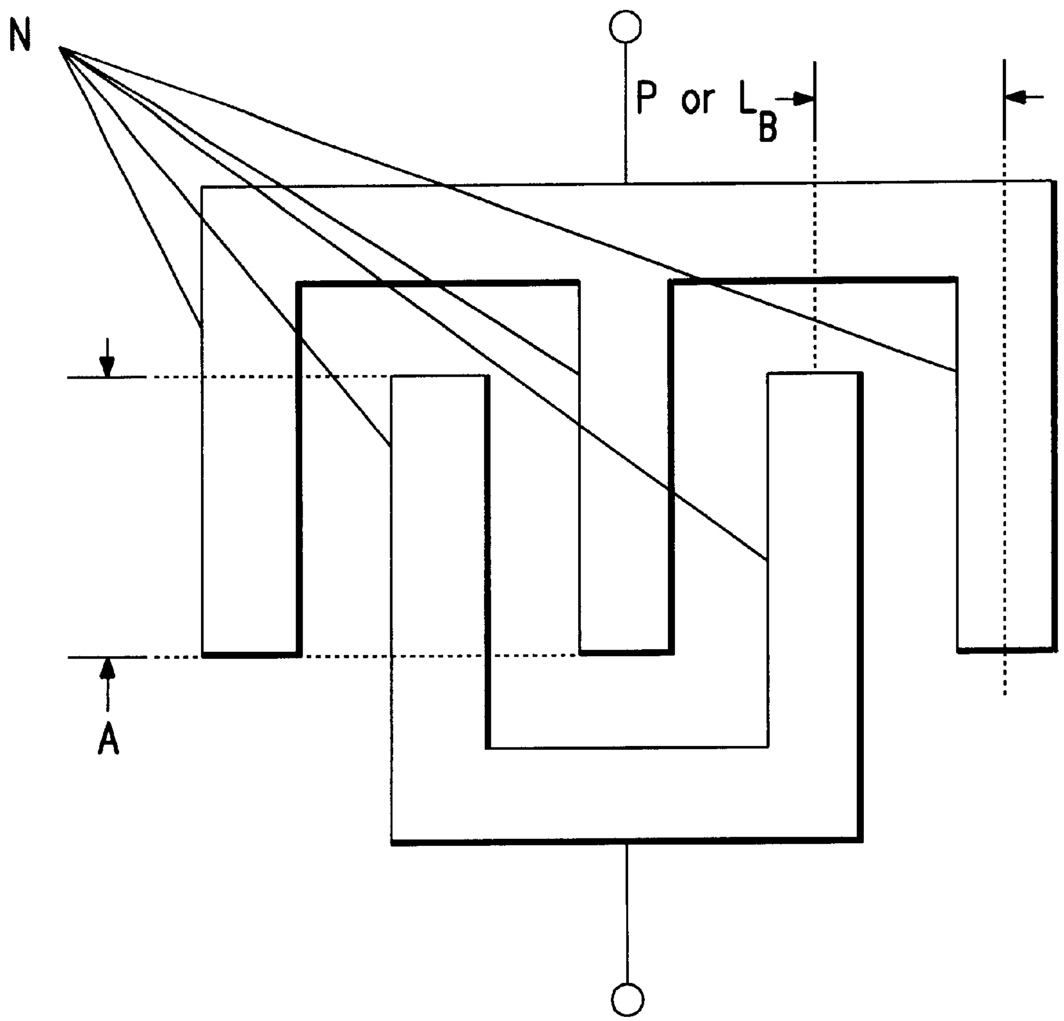
FIG. 6 illustrates the parameters of an IDT which can be varied in accordance with the subject invention.

FIG. 6 illustrates the structure of one embodiment of an IDT. The parameter N is the number of fingers of the IDT. For illustrative purposes only, a five-finger IDT is illustrated in FIG. 6, but it should be appreciated that the number of fingers may and typically does vary from three to many more than three. In one implementation, the number of fingers of the IDT should not exceed two times the center frequency of the filter divided by the filter bandwidth.

The pitch P is the spacing between the fingers of the IDT. Typically, this spacing is called the Bragg length, $L_B$, which is close to ½λ, where λ is the wavelength of the acoustic wave that is generated within the filter. Typically, the pitch P of the IDT is a uniform value for all the fingers of the IDT.

The aperture A is the amount of overlap between fingers of opposing polarity.

Figure 7:
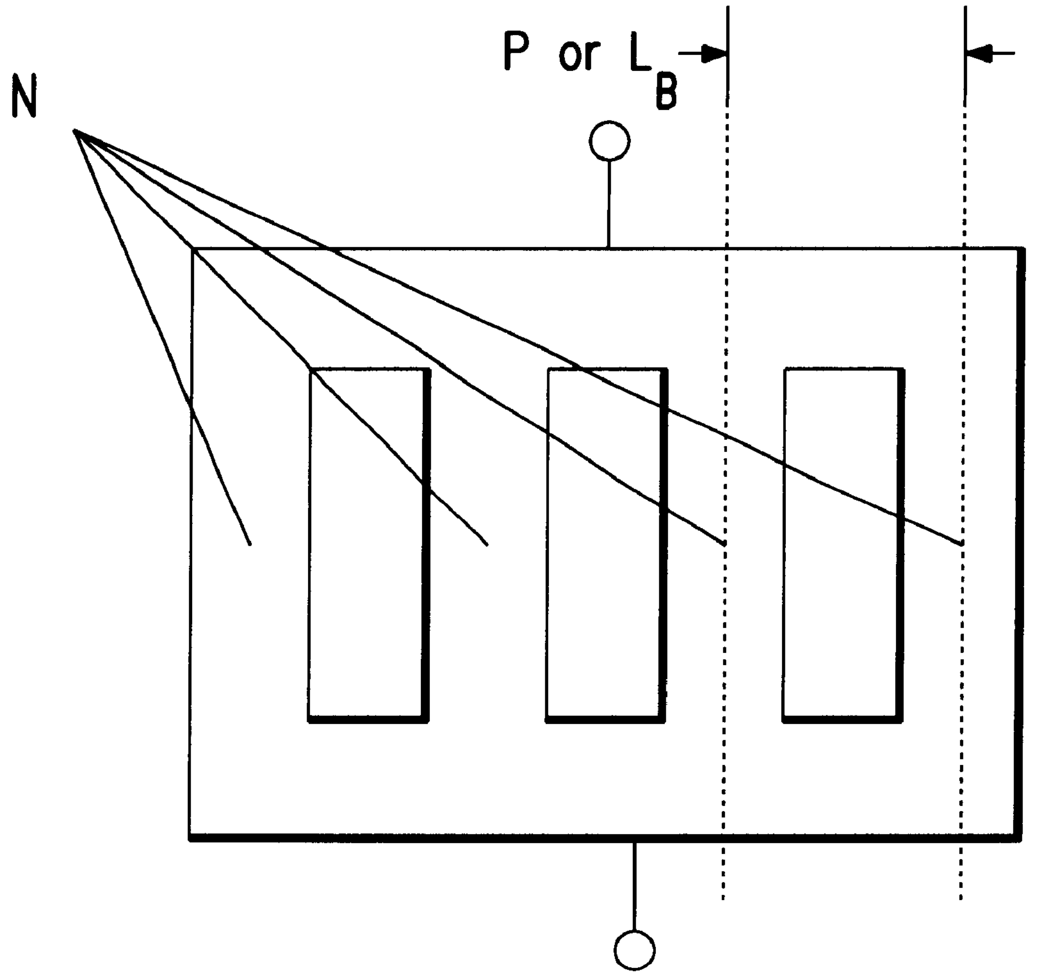
FIG. 7 illustrates the parameters of a reflector which can be varied in accordance with the subject invention.

FIG. 7 illustrates the structure of one embodiment of a reflector. The parameter N is the number of fingers of the reflector. For illustrative purposes only, a four-finger reflector is illustrated in FIG. 7, but it should be appreciated that the number fingers of the reflector typically has many more than four.

The pitch P is the spacing between the fingers of the reflector. This spacing is the Bragg length, $L_B$. Moreover, the pitch of the reflector is typically a uniform value for all the fingers of the reflector.

In one implementation, the filter system of FIG. 4 is optimized by varying one or more of the following parameters to achieve one or more desired filter characteristics: the pitch of IDTs 4, 5, and reflectors 22*a*, 22*b*, 22*c*; the number of fingers of IDTs 4, 5, and reflectors 22*a*, 22*b*, 22*c*; the gap between IDT 4 and reflector 22*a*, the gap between reflectors 22*a* and 22*b*, the gap between reflectors 22*b* and 22*c*, and the gap between reflector 22*c* and IDT 5. The result is 14 parameters or degrees of freedom which can be varied to achieve the desired optimization. Of course, additional degrees of freedom will be available in the case in which more than 3 reflectors are inserted in the gap 8 between the IDTs 4,5.

In this implementation, the one or more desired filter characteristics that can be used to drive the optimization may include one or more of the following: 1) minimizing ripple in the filter passband; 2) maximizing the attenuation in the filter stopband; 3) minimizing insertion loss; 4) minimizing sensitivity to parameter changes; and 5) maximizing the buildability of the filter.

It may be desirable to eliminate one or more of the foregoing degrees of freedom in the interest of buildability. That will generally be possible since the required number of degrees of freedom to achieve a particular frequency response shape and terminating impedance, equal to the number of desired poles plus 2, will typically be less than the number of available degrees of freedom. For example, in a lossless six-pole SAW filter configured in accordance with the invention, eight variables including the aperture are needed to control the termination resistance, center frequency, bandwidth, and passband ripple.

For example, a filter which exhibits mirror image symmetry is typically easier to manufacture than one which does not. Mirror image symmetry requires that the pitch of IDT 4 equals that of IDT 5, that the number of fingers of IDT 4 equals that of IDT 5, that the gap between IDT 4 and reflector 22*a* equals that between reflector 22*c* and IDT 5, that the pitch of reflector 22*a* equals that of reflector 22*c*, that the number of fingers of reflector 22*a* equals that of reflector 22*c*, and that the gap between reflector 22*a* and 22*b* equals that between reflector 22*b* and 22*c*. Satisfaction of these conditions results in a reduction in the available degrees of freedom from 14 to 9. That is acceptable in the example shown in FIG. 4 since the required number of degrees of freedom to achieve a particular impedance and frequency response shape is 8, or $N_p+2$. In other applications, it may be desirable to set the reflector gap lengths and pitches equal.

Figure 5:
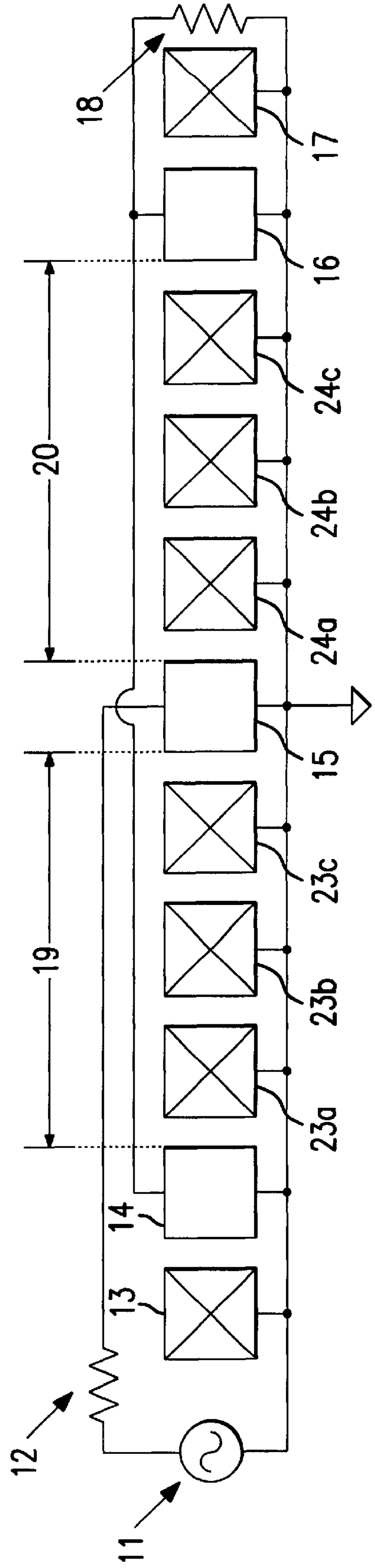
FIG. 5 illustrates a second embodiment of a filter system in accordance with the subject invention.

A second embodiment of the subject invention is illustrated in FIG. 5. As illustrated, in this embodiment three IDTs, identified respectively with numerals 14, 15, and 16, are included within the cavity defined by the outer reflectors 13 and 17. Relative to FIG. 2, like elements in FIG. 5 are referenced with like identifying numerals.

Figure 2:
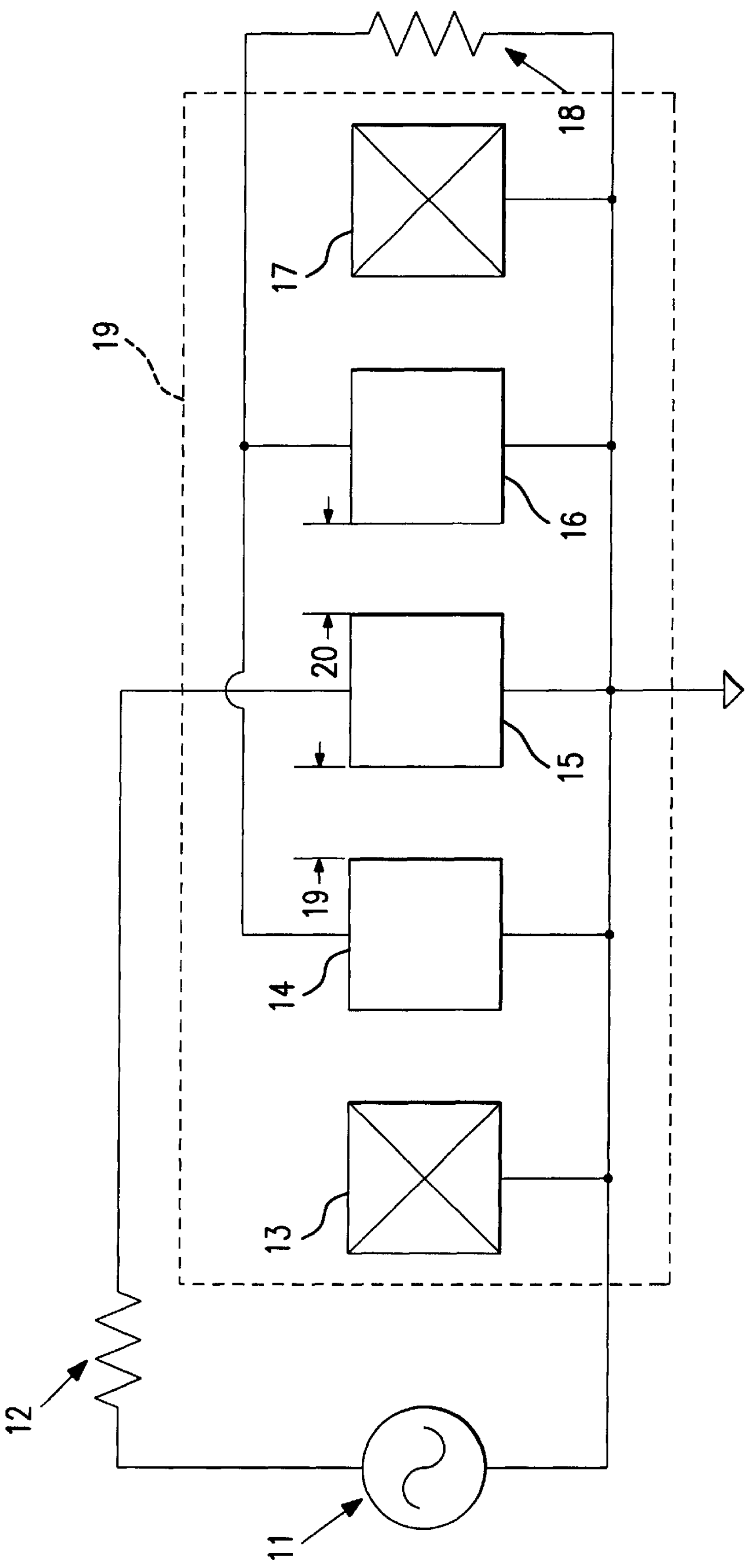
Figure 3:
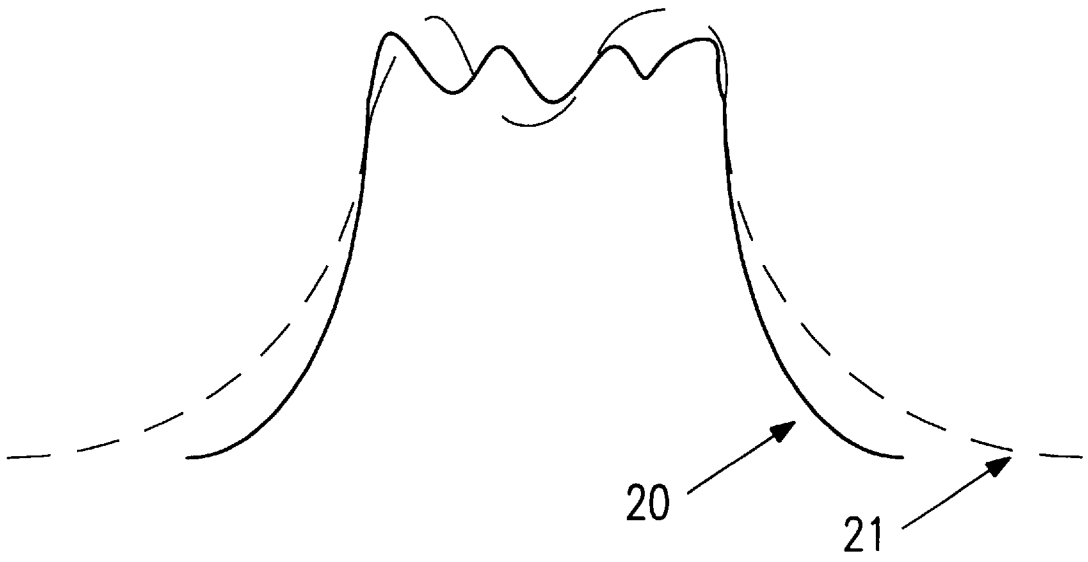
FIG. 3 illustrates the relationship between frequency selectivity and the number of filter poles.

In this embodiment, compared to the embodiment of FIG. 2, a virtually unlimited number of poles can be added to the filter transfer function by widening the gaps 19, 20 between source IDT 15 and the two load IDTs 14, 15, and inserting therein an appropriate number of reflectors. In the embodiment of FIG. 5, three reflectors are inserted into each of the gaps 19 and 20, but it should be appreciated that it is possible to insert more than three reflectors into each of these gaps depending on the particular application. The number of reflectors which is inserted determines the number of poles in the frequency response of the filter. In the embodiment of FIG. 5, it is necessary to maintain mirror image symmetry about IDT 15. In one embodiment, the number of poles in the frequency response of the filter is equal to the number of reflectors inserted in each of the gaps plus 3. In the particular example illustrated in FIG. 5, since three reflectors are inserted into each of the gaps 19 and 20, the number of poles in the filter frequency response is six. This embodiment is not restricted to realizing a number of poles equal to 3 plus the number of reflectors. Some designs, usually of narrow bandwidth, may only realize a number of poles equal to 2 plus the number of reflectors. Greater numbers of poles than 3 plus the number of reflectors do not have the degrees-of-freedom to be able to realize a general specified response.

Compared to the conventional filter system of FIG. 2, the number of poles in the transfer function of the filter of FIG. 5 can be increased by increasing the number of reflectors inserted in the gaps 19 and 20 between the IDTs 14, 15, 16. In contrast, the number of poles in the transfer function of the filter of FIG. 2 is increased by cascading multiple ones of the filter system of FIG. 2. The drawback of this approach is that, as more and more filters are cascaded with one another, the insertion loss of the overall system goes up. The result is that the frequency selectivity of the system can be increased only by significantly increasing the insertion loss and size of the overall system. In contrast, in the filter system of FIG. 5, the frequency selectivity of the system can be increased with a less significant increase in insertion loss.

In one implementation, the filter system of FIG. 5 is optimized by varying one or more of the following parameters, while maintaining mirror-image symmetry, to achieve one or more desired filter characteristics: the aperture, the pitch of IDTs 14, 15, 16, and of reflectors 23*a*, 23*b*, 23*c*, 24*a*, 24*b*, 24*c*; the number of fingers in IDTs 14, 15, 16, and in reflectors 23*a*, 23*b*, 23*c*, 24*a*, 24*b*, 24*c*; the gap between IDT 14 and reflector 23*a*, the gap between reflectors 23*a* and 23*b*, the gap between reflectors 23*b* and 23*c*, the gap between reflector 23*c* and IDT 15, the gap between IDT 15 and reflector 24*a*, the gap between reflectors 24*a* and 24*b*, the gap between reflectors 24*b* and 24*c*, and the gap between reflector 24*c* and IDT 16. Mirror image symmetry requires that the pitch of IDT 14 equal that of IDT 16, that the number of fingers of IDT 14 equal that of IDT 16, that the gap between IDT 14 and reflector 23*a* equal that between reflector 24*c* and IDT 16, that the pitch and number of fingers of reflector 23*a* equal that of reflector 24*c*, that the pitch and number of fingers of 23*b* and 24*b* be equal, that the pitch and number of fingers of 23*c* and 24*a* be equal, that the gap between reflectors 23*a* and 23*b* equal that between reflectors 24*b* and 24*c*, that the gap between reflectors 23*b* and 23*c* equal that between 24*b* and 24*a*, and that the gap between reflector 23*c* and IDT 15 equal that between IDT 15 and reflector 24*a*. Satisfaction of these conditions results in a reduction in the available degrees of freedom from 27 to 15. That is acceptable in the example shown in FIG. 5 since the required number of degrees of freedom to achieve a particular frequency response shape is 8, or $N_p+2$. The result is 15 parameters or degrees of freedom which can be varied to achieve the desired optimization. Of course, additional degrees of freedom will be available in the case in which more than 3 reflectors are inserted in the gaps 19, 20 between the IDTs 14, 15, 16.

In this implementation, the one or more desired filter characteristics that can be used to drive the optimization may include one or more of the following: 1) minimizing ripple in the filter passband; 2) maximizing the attenuation in the filter stopband; 3) minimizing insertion loss; 4) minimizing sensitivity to parameter changes; and 5) maximizing the buildability of the filter.

It may be desirable to eliminate one or more of the foregoing degrees of freedom in the interest of buildability. That will generally be possible since the required number of degrees of freedom to achieve a particular frequency response shape and termination, is equal to the number of desired poles plus 2, will typically be less than the number of available degrees of freedom.

Figure 17:
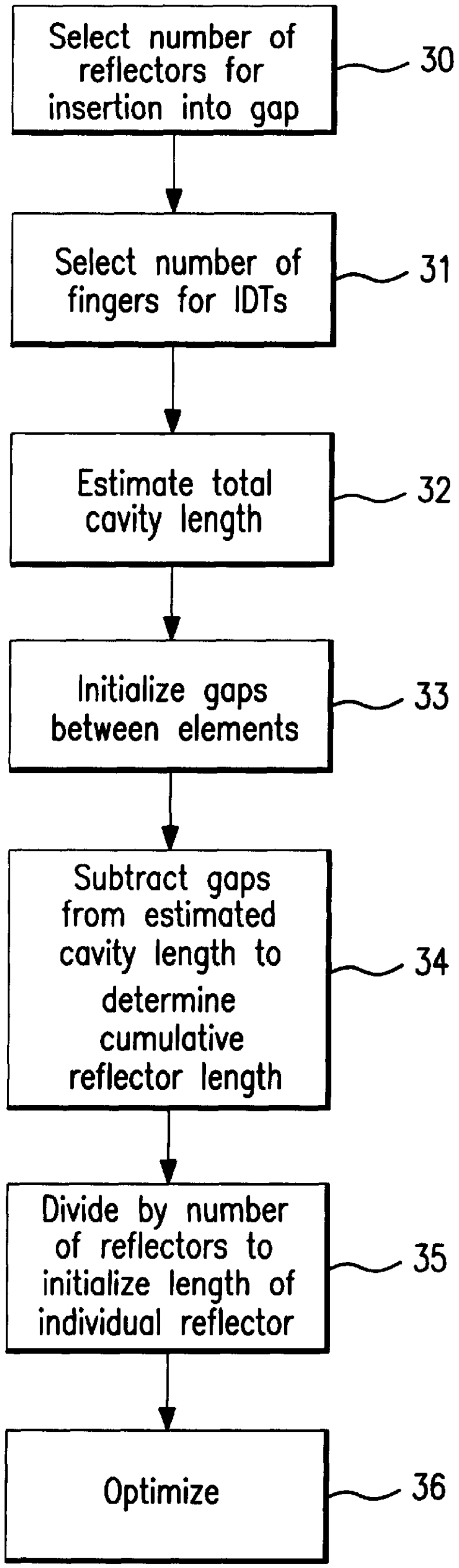
FIG. 17 illustrates a method of designing a filter in accordance with one embodiment of the subject invention.

A flowchart of a method of designing a filter in accordance with the subject invention is illustrated in FIG. 17. Steps 30–35 comprises initialization steps in which one or more filter parameters are initialized. Step 36 is an optimization step in which the parameters initialized in the previous steps are varied in order to optimize one or more desired filter characteristics (subject to real world constraints). A more detailed description of these steps follows.

In step 30, the number of reflectors to be inserted into the gap, or gaps, between source and destination IDTs is selected. In the embodiment of FIG. 4, this step comprises selecting the number of reflectors for insertion into gap 8. In the embodiment of FIG. 5, this step comprises selecting the number of reflectors for insertion into gaps 19, 20. In one implementation, the number of reflectors to be inserted into gap 8 of the FIG. 4 embodiment is obtained by adding 3 to the number of poles, $N_p$, in the desired filter response. Similarly, in one implementation, the number of reflectors to be inserted into each of the gaps 19, 20 of the FIG. 5 embodiment is obtained by adding 3 to $N_p$. In this implementation, to achieve mirror image symmetry, the number of reflectors to be inserted into the other of the two gaps is identical.

In step 31, the number of fingers in the source and load IDTs is initialized. With reference to FIG. 4, the source and load IDTs are identified with numerals 4 and 5. With reference to FIG. 5, the source IDT is identified with numeral 15; the two destination IDTs are identified with numerals 14 and 16. Since mirror image symmetry is desired, it is required that we equate the number of fingers in IDTs 4 and 5 of FIG. 4, and equate the number of fingers in IDTS 14 and 16 in FIG. 5. This parameter is a critical one, for it determines the location of the attenuation poles of the filter response, and is therefore a key determinant of the filter response shape. In one implementation, a rule of thumb is that the number of fingers in an IDT should not exceed two times the center frequency of the filter divided by the filter bandwidth. Once the number of fingers in each of the IDTs is initialized, the length L of each IDT can be initialized to a value determined by multiplying the number of fingers in the IDT, $N_f$, by the Bragg length. In other words, $L=N_f \times L_B$.

In step 32, the total cavity length $L_c$ is estimated. In one implementation, this value is estimated from the equation $L_c=K\times(f_0/B_3)\times N_p$, where K is 0.7±0.1 for the embodiment of FIG. 4, and where K is 1.4±0.2 for the embodiment of FIG. 5, with the precise value depending on the objective of the design (e.g., low insertion loss, low passband ripple, etc.) and the positions of the attenuation poles; $f_0$ is the center frequency; $B_3$ is the 3 dB bandwidth; and $N_p$ is the desired number of poles in the filter response.

In step 33, the gaps between IDTs and reflectors and between different ones of the reflectors are initialized. In one implementation, the gap is expressed in terms of the excess amount of the spacing between an IDT and a reflector, or between two reflectors, compared to the spacing between fingers of adjacent IDTs or reflectors, or the spacing between an IDT and a reflector. In this implementation, the gaps are initialized to 0.7 of a Bragg length. With reference to FIG. 4, this initialization procedure is applied to the gaps between IDT 4 and reflector 22*a*, between reflectors 22*a* and 22*b*, between reflectors 22*b* and 22*c*, and between reflector 22*c* and IDT 5. With reference to FIG. 5, it is applied to the gaps between IDT 14 and reflector 23*a*, between reflectors 23*a* and 23*b*, between reflectors 23*b* and 23*c*, between reflector 23*c* and IDT 15, between IDT 15 and reflector 24*a*, between reflectors 24*a* and 24*b*, between reflectors 24*b* and 24*c*, and between reflectors 24*c* and IDT 16.

In step 34, the cumulative reflector length is estimated. With reference to FIG. 4, this is the cumulative length of all of the reflectors inserted into the gap 8. In one implementation, this step is performed in the FIG. 4 embodiment by subtracting from the total cavity length estimated in step 32 the lengths of the source and load IDTs (IDTs 4 and 5 in FIG. 4) and the spacings initialized in step 33. With reference to FIG. 5, this is the cumulative length of all the reflectors inserted into the gap 19, and into the gap 20. In one implementation, this step is performed in the FIG. 5 embodiment by subtracting from the total cavity length estimated in step 32 the lengths of the source and load IDTs (IDTs 14, 15, and 16 in FIG. 5) and the spacings initialized in step 33.

In step 35, the length of each reflector to be inserted into the gap or gaps between the source and destination IDTs is initialized from the cumulative reflector length estimated in step 34 and the number of reflectors to be inserted as determined in step 30. In one implementation, applicable to the FIG. 4 embodiment, this step is performed by dividing the cumulative reflector length by the number of reflectors from step 30, and then setting the filter lengths to the resulting value rounded to the nearest even integer while maintaining mirror image symmetry. In one implementation, applicable to the FIG. 5 embodiment, this step is performed by dividing the cumulative reflector length by twice the required number of reflectors from step 30, and then setting the filter lengths to the resulting value rounded to the nearest even integer while maintaining mirror image symmetry.

In step 36, an optimization procedure is performed in which one or more of the foregoing parameters are varied, subject to one or more constraints, to optimize one or more desired filter characteristics, e.g., minimum passband ripple, maximum stopband attenuation, minimum insertion loss, etc. The constraints most often will include a requirement that mirror image symmetry be maintained, and that the number of fingers in an IDT not exceed twice the center frequency divided by the filter bandwidth, etc. In one implementation example, this optimization is performed using known linear programming techniques according to which an objective function is defined in terms of one or more variables, constraints on the variables are defined, and then the objective function is optimized (either maximized or minimized) subject to the constraints. The result of this procedure is the values of the variables that achieve optimum results subject to the defined constraints.

As with the conventional SAW filters of FIGS. 1 and 2, the filter of the subject invention may be cascaded to provide additional stopband selectivity. For example, a 12-pole filter can be realized by cascading two of the filters shown in FIG. 4. This is accomplished by removing the output impedance 7 of the first section, and the input impedance 2 of the second section, and then connecting the terminal of the IDT 5 of the first section to the terminal of the IDT 4 of the second section. The sections can be situated on the same or different substrates.

EXAMPLES

Figure 8:
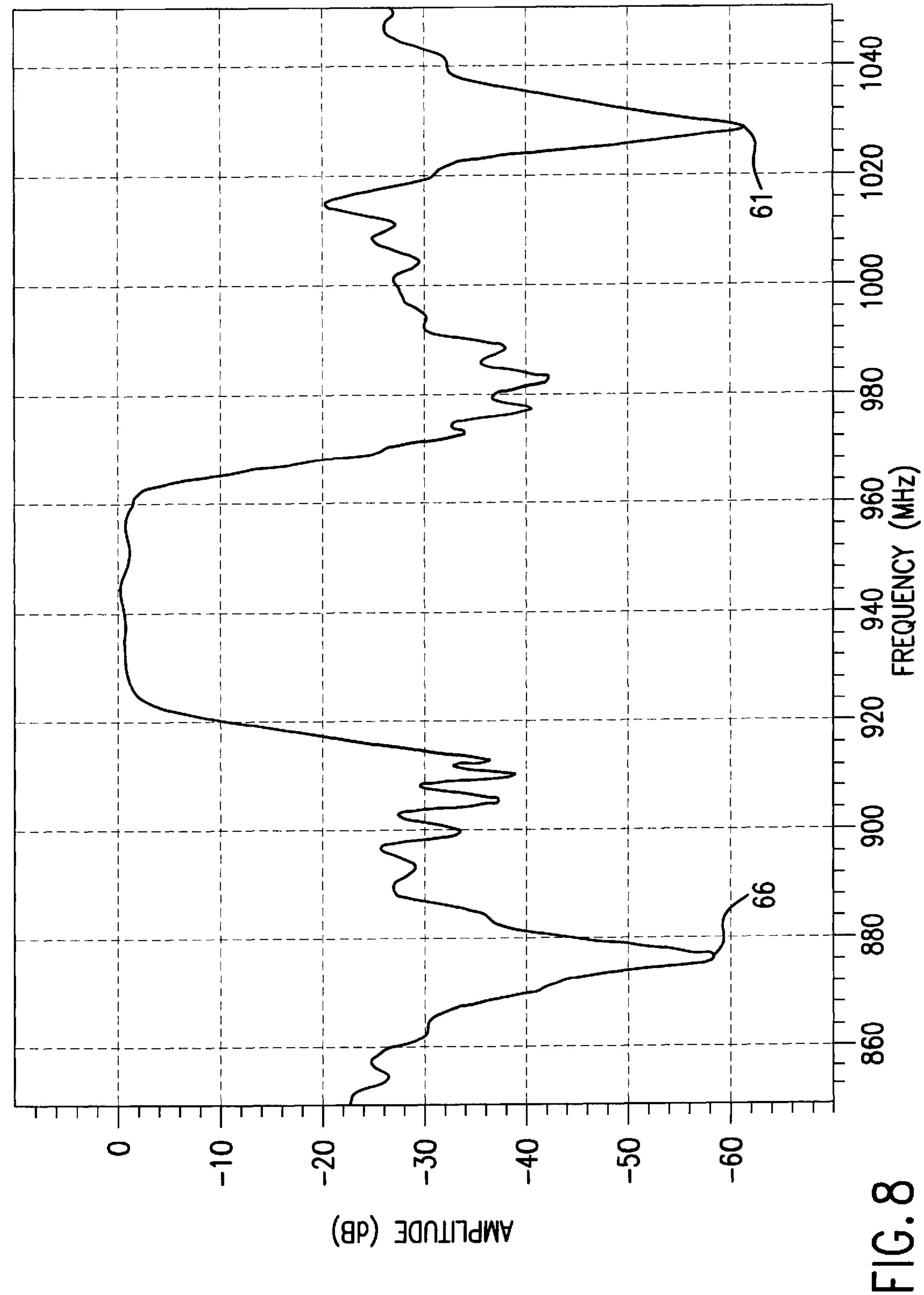
FIG. 8 illustrates the simulated frequency response of a first implementation example of a two-IDT filter system configured in accordance with the subject invention.

FIG. 8 illustrates the simulated frequency response of a particular implementation of the filter system of FIG. 4, in which the filter system is configured to have 6 poles (through insertion of 3 reflectors in the gap 8), and in which IDTs 4 and 5 are each configured to have 27 fingers. The attenuation poles 60 and 61 result from the sinx/x response of the IDTs. The other stopband ripples are due to reflections in the outside reflectors 3 and 6.

Figure 9:
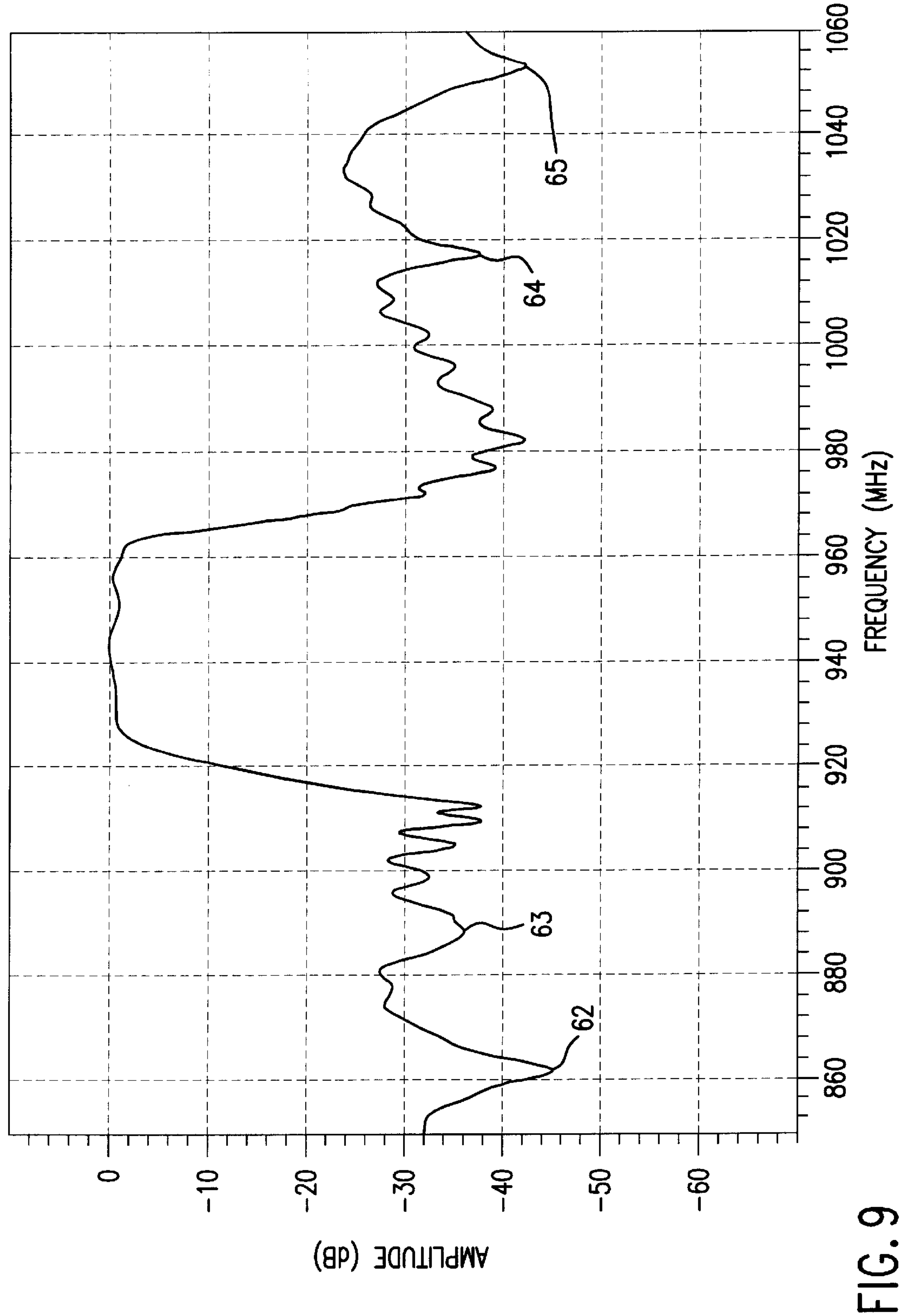
FIG. 9 illustrates the simulated frequency response of the implementation example of FIG. 8 modified by altering the relative number of fingers in the source and load IDTs.

By reducing the number of fingers in one IDT, from 27 to 21, while increasing the number of fingers in the other IDT, from 27 to 33, while maintaining a constant total of 54 fingers, the frequency response of FIG. 9 is obtained. Note that each of the poles 60, 61 of FIG. 8 has been split into two poles, identified in FIG. 9 with numerals 62, 63, 64, 65, with poles 62, 63 in FIG. 9 originating from pole 60 in FIG. 8, and with poles 64, 65 in FIG. 9 originating from pole 61 in FIG. 8. The results in less variation in the filter stopband with a slightly degraded filter passband.

Figure 10:
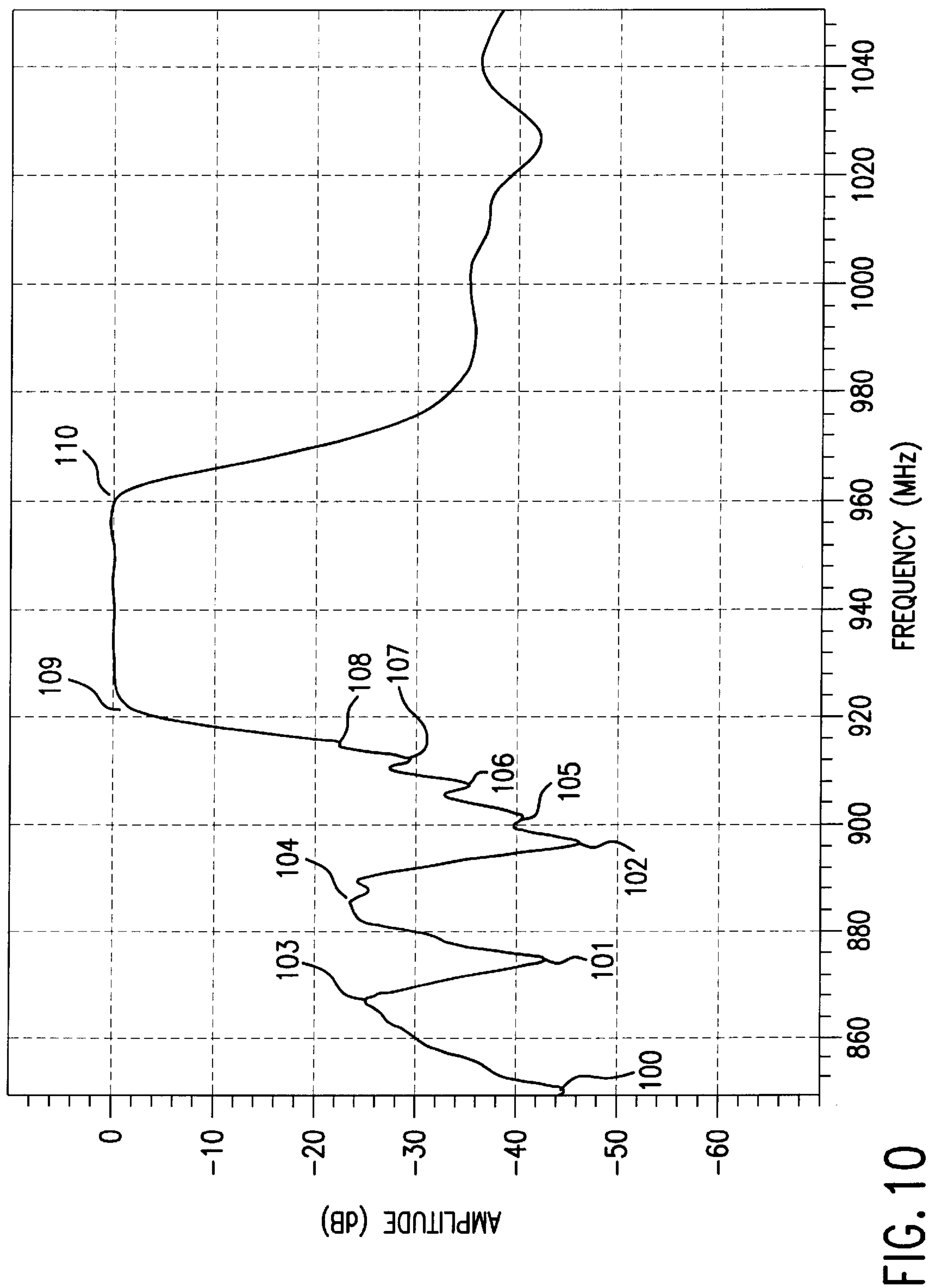
FIGS. 10 and 11 illustrate the simulated frequency response of a second implementation example of a three-IDT filter system configured in accordance with the subject invention.

FIG. 10 illustrates the simulated frequency response of a particular implementation of the filter system of FIG. 5, in which 3 reflectors are inserted into each of the gaps 19 and 20 in order to achieve a 6-pole transfer function. In this implementation, IDTs 14 and 16 configured to have 27 fingers, while IDT 15 is configured to have 39 fingers. In addition, each of reflectors 23*a*–23*c*, 24*a*–24*c* is configured to have 12 fingers. The attenuation poles 100, 101, 102 in the lower stopband create a uniform stopband response with approximately equal amplitude returns 103, 104. Ripples 105–108 at the low frequency portion of the passband are due to reflections from the outer reflectors 13, 17 in FIG. 5. Note that the attenuation poles and reflection ripples are heavily damped in the upper portion of the stopband as is common in filters using the leaky mode of vibration.

Figure 11:
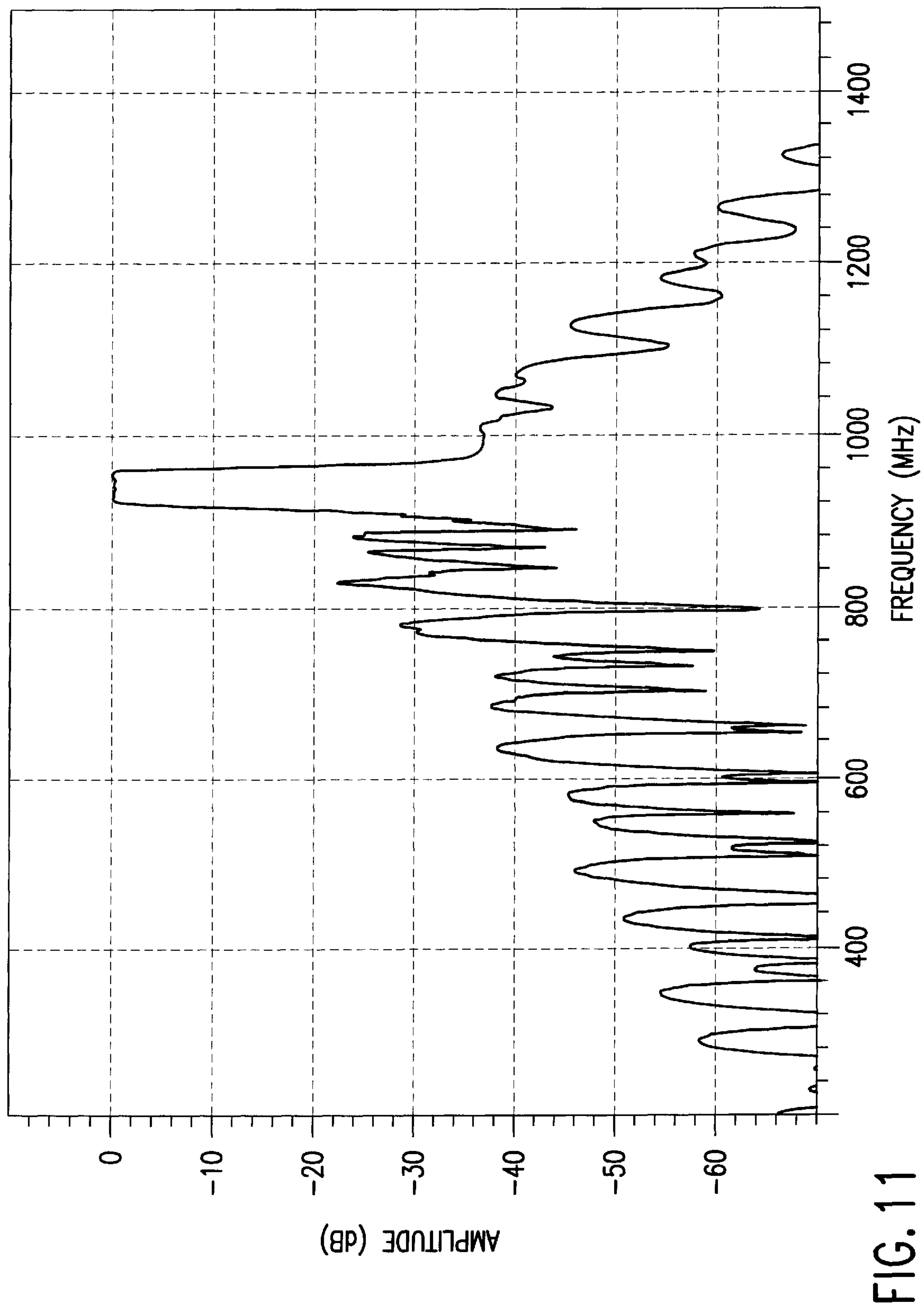

FIG. 11 illustrates an expanded frequency range response curve for the previously-discussed implementation. This curve illustrates an improvement in stopband rejection compared to conventional SAW filters which improvement is characteristic of filters configured in accordance with the subject invention.

Figure 12:
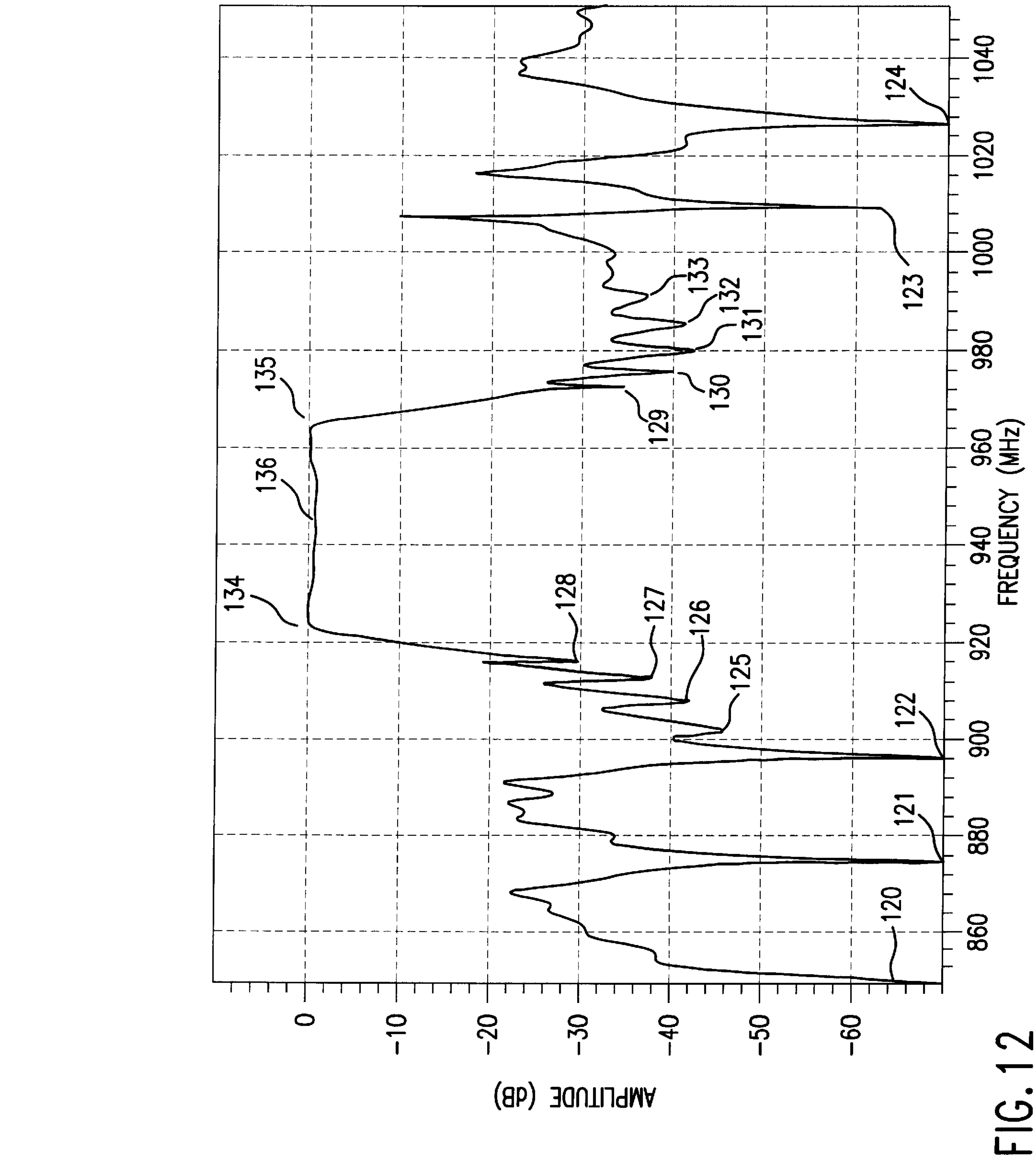
FIG. 12 illustrates the simulated frequency response of the second implementation example of FIGS. 10 and 11 assuming all internal losses have been removed.

FIG. 12 illustrates the simulated frequency response curve for the previously-discussed implementation assuming all internal losses have been removed. Note the sharpness of the attenuation poles 120–124, as well as the attenuation dips 125–133 due to the outside reflectors 13, 17 of FIG. 5. Note also that the passband edges 134, 135 are elevated in relation to the center 136 of the passband, and have sharp corners compared to the corners 109, 110 of FIG. 10, which assumes internal losses. The elevated corners are the result of optimizing the filter with its internal losses present, as opposed to optimizing a lossless filter. Either method is valid, though there may be a tradeoff between a flat passband response and sensitivity.

Figure 13:
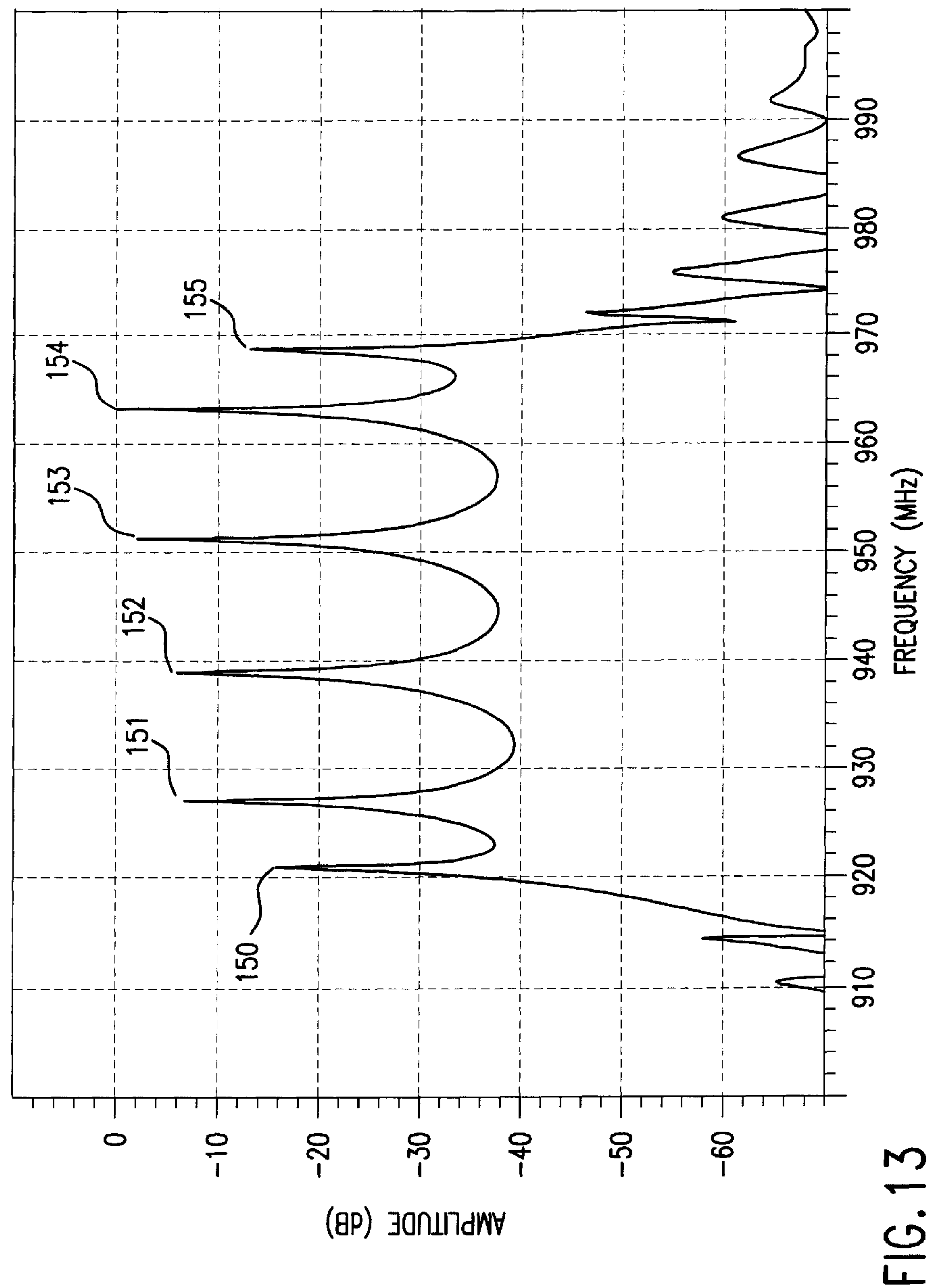
FIG. 13 illustrates the simulated frequency response of the second implementation example of FIGS. 10 and 11 assuming high values of source and load impedances.

FIG. 13 illustrates the simulated frequency curve for the previously discussed implementation, assuming all internal losses have been removed, but also with very high values of source and load impedances to simulate open circuit conditions. In the s-plane, these conditions result in the natural frequencies of the filter (corresponding to the 6 poles) being moved to the $j\omega$ axis. This results in the 6 peaks 150–155 in the frequency response. This shows that the reflector-controlled filter has the same characteristics as a conventional LC ladder filter.

Figure 14:
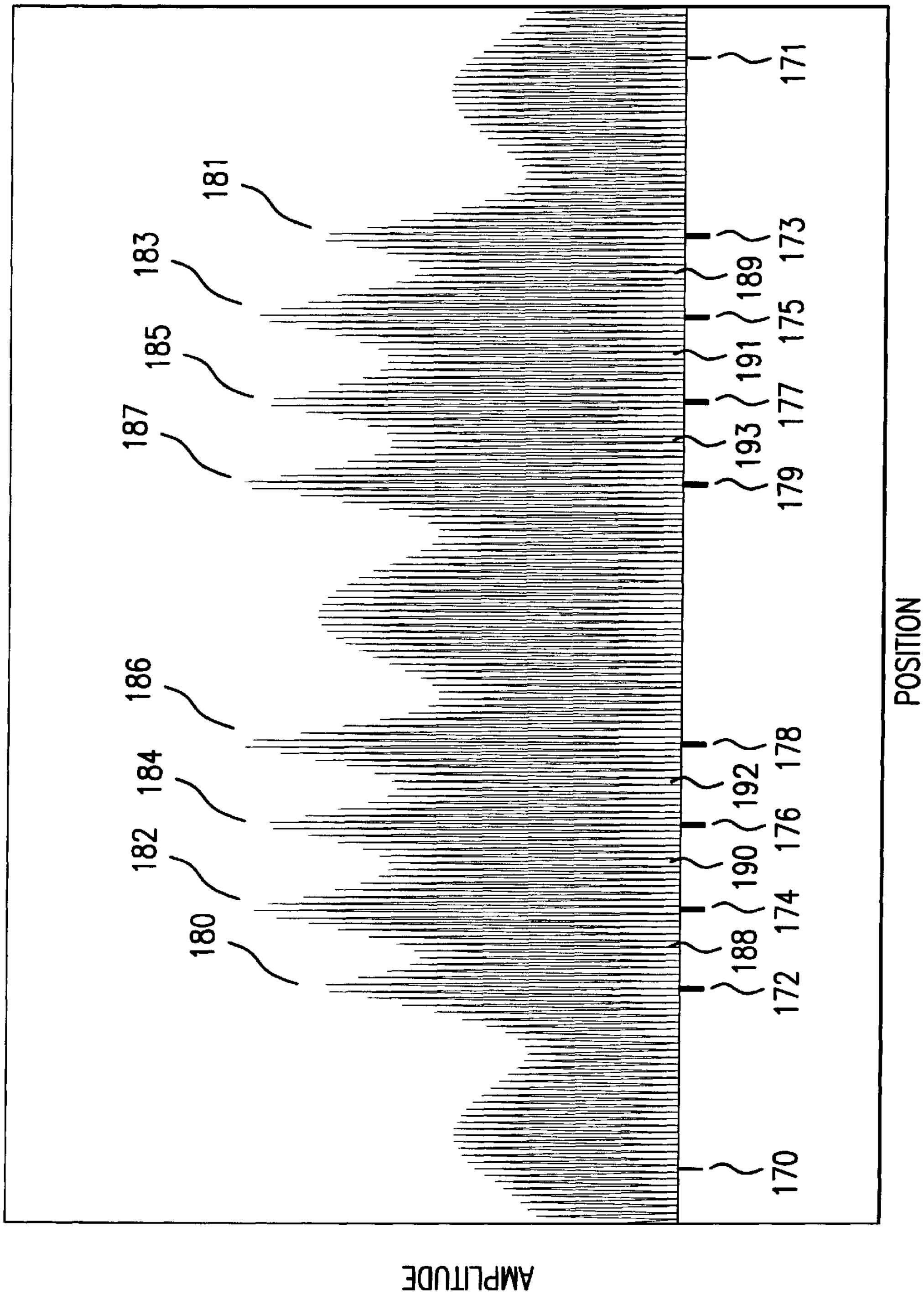
FIG. 14 illustrates the simulated absolute magnitude of the amplitude of the lowest natural frequency acoustic wave along the length of the second implementation example of FIGS. 10 and 11.

FIG. 14 illustrates the simulated absolute magnitude of the amplitude of the acoustic wave along the length (corresponding to the horizontal axis) of the previously discussed implementation of the filter system of FIG. 5 at the lowest natural frequency 150 shown in FIG. 13. The portions identified with numerals 170 and 171 respectively correspond to the gaps between reflector 13 and IDT 14, and between IDT 16 and reflector 17. The portions identified with numerals 172, 174, 176, 178, 179, 177, 175, and 173 respectively correspond to the gaps between IDT 14 and reflector 23*a*, between reflectors 23*a* and 23*b*, between reflectors 23*b* and 23*c*, between reflector 23*c* and IDT 15, between IDT 15 and reflector 24*a*, between reflectors 24*a* and 24*b*, between reflectors 24*b* and 24*c*, and between reflectors 24*c* and IDT 16. The portions identified with numerals 188, 190, 192, 193, 191, and 189 respectively correspond to reflectors 23*a*, 23*b*, 23*c*, 24*a*, 24*b*, and 24*c*. Note that the amplitude peaks 180, 182, 184, 186, 187, 185, 183, 181 roughly correlate respectively with gap regions 172, 174, 176, 178, 179, 177, 175, and 173.

Figure 15:
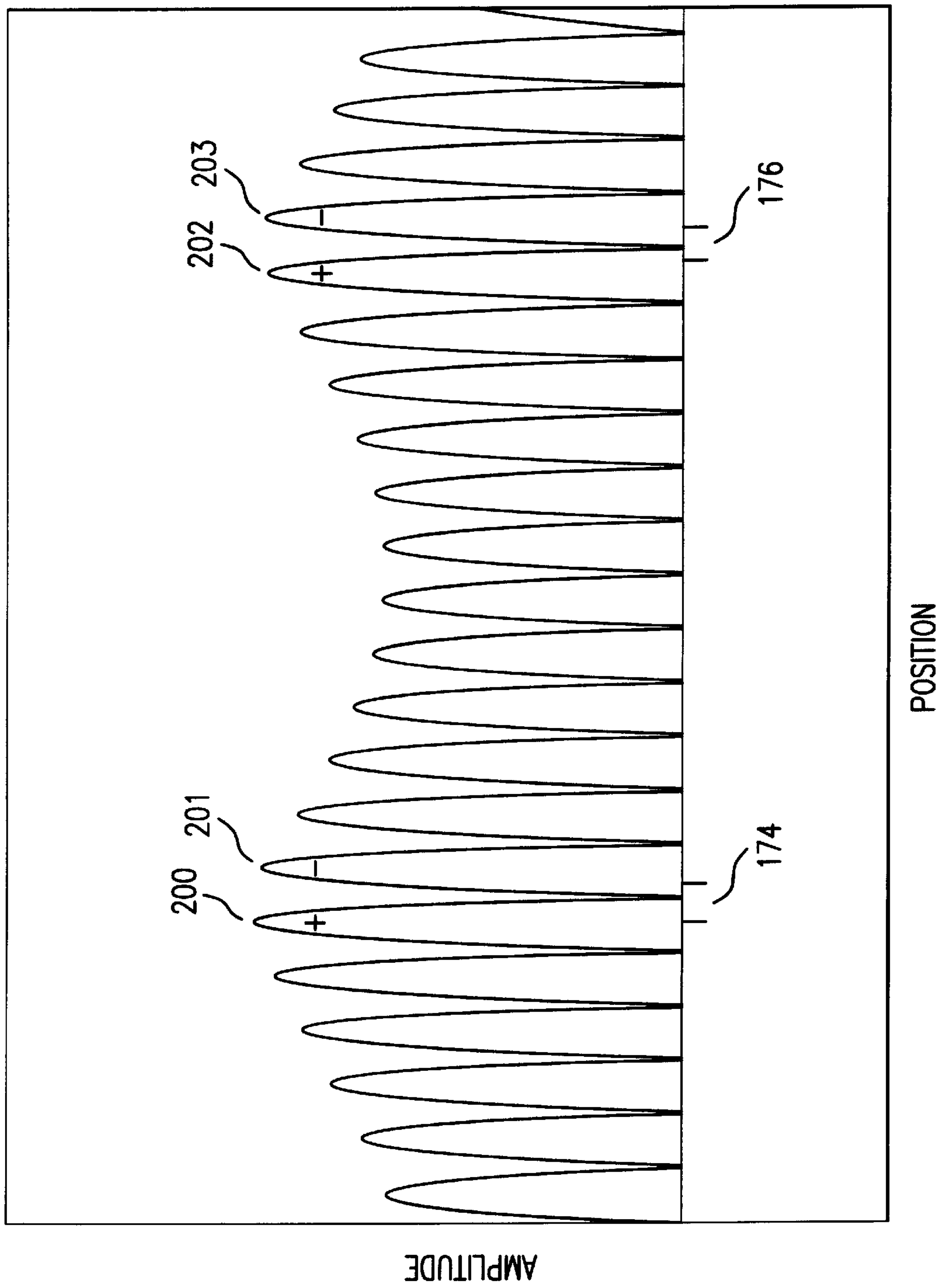
FIG. 15 illustrates the simulated absolute magnitude of the amplitude of the acoustic wave of FIG. 14 near the first and second IDT gaps of the second implementation example of FIGS. 10 and 11.

FIG. 15 illustrates the region of the simulated lowest natural frequency acoustic wave curve of FIG. 14 in the vicinity of the gap regions 174, 176 which respectively correspond to the gaps between reflectors 23*a* and 23*b*, and between reflectors 23*b* and 23*c* in FIG. 5. The figure illustrates the absolute value of the simulated acoustic wave; however, adjacent peaks have opposite polarities. Thus, by keeping track of the polarities of the wave, if peak 200 is assigned a positive polarity, peak 201 will have a negative polarity, peak 202 will have a positive polarity, and peak 203 will have a negative polarity. Note that the regions 174, 176 surrounding the previously identified gaps are in-phase in that peak 200 has the same polarity as peak 202, and peak 201 has the same polarity as peak 203.

Figure 16:
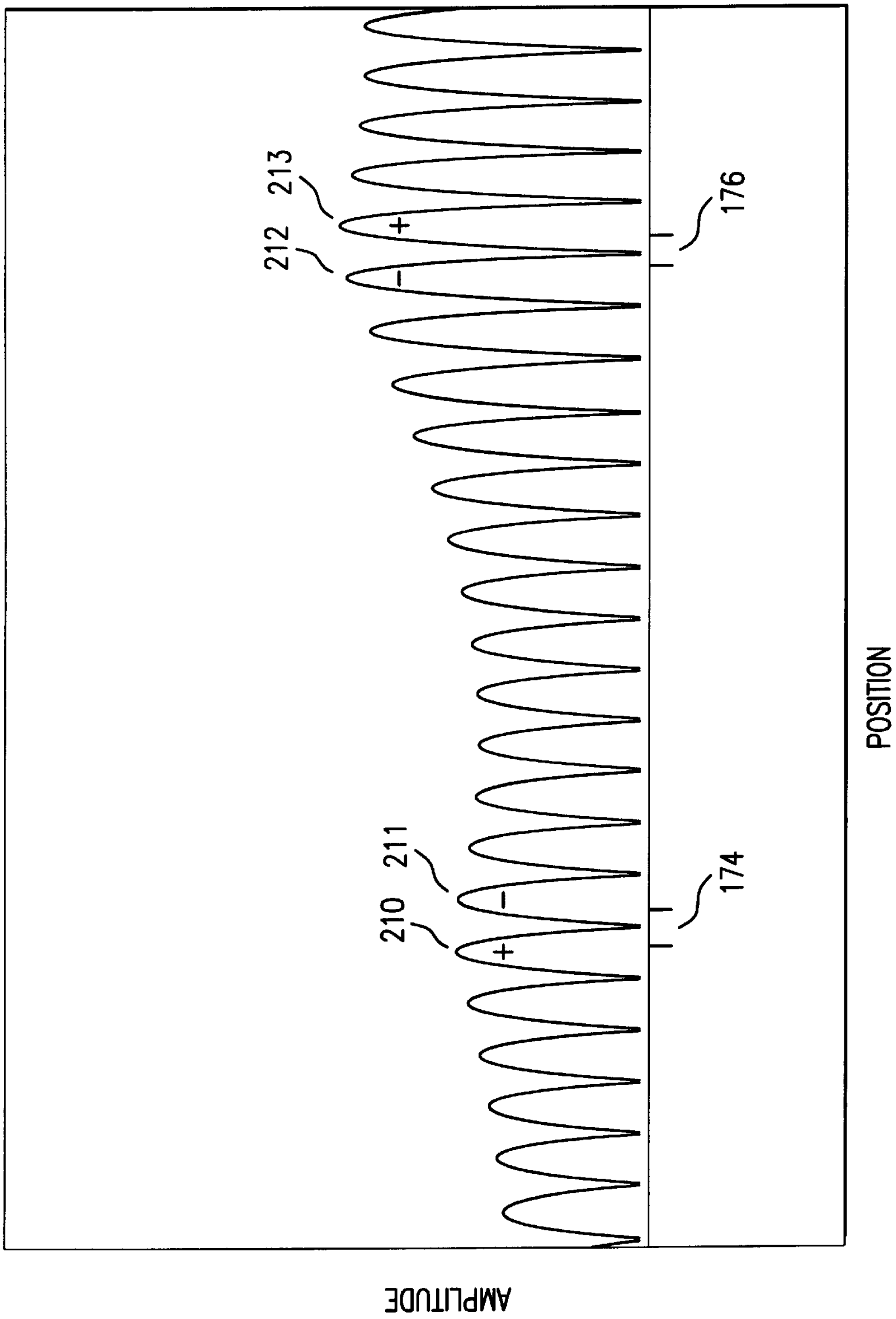
FIG. 16 illustrates the simulated absolute magnitude of the amplitude of the highest natural frequency acoustic wave near the first and second IDT gaps of the second implementation example of FIGS. 10 and 11.

FIG. 16 illustrates the region of the simulated acoustic curve for the filter implementation discussed previously in relation to FIG. 14 in the vicinity of the gap regions 174, 176. In contrast to FIGS. 14–15, the curve of FIG. 16 is simulated at the highest natural frequency 155 of FIG. 13. Note that the portions of the curve in the immediate vicinity of regions 174, 176 are out of phase with respect to one another. Thus, peak 210 has a polarity opposite to that of peak 212, and peak 211 has a polarity opposite to that of peak 213.

By observing the phase relationships illustrated in FIGS. 14–16, it is observed that the filter of the subject invention behaves akin to an electrical LC ladder composed of parallel inductor-capacitor resonators in the shunt arms and inductors in the series arms. A mechanical analogy involves spring coupling between mechanical resonators.

While embodiments, implementations, and implementation examples have been shown and described, it should be apparent that there are many more embodiments, implementations, and implementation examples that are within the scope of the subject invention. Accordingly, the subject invention is not to be restricted except in light of the appended claims and their equivalents.

What is claimed is:

1. A surface acoustic wave electromechanical filter:

first and second reflectors defining a filter cavity;

source and load interdigital transducers within the cavity and spaced by a gap; and a number of reflectors inserted in the gap, the number being greater than or equal to one, the inserted reflectors configured to increase the number of poles in the resultant frequency response by the number of inserted reflectors, and thereby increase the frequency selectivity of the filter.

2. The filter of claim 1 wherein there is one source interdigital transducer and one load interdigital transducer.

3. The filter of claim 2 wherein the number of reflectors inserted in the gap is equal to the number of desired poles minus three.

4. The filter of claim 2 wherein the first and second reflectors, the interdigital transducers, and the inserted reflectors are longitudinally coupled.

5. The filter of claim 2 configured to exhibit mirror image symmetry.

6. The filter of claim 2 wherein the interdigital transducers have an equal number of fingers.

7. The filter of claim 2 wherein the interdigital transducers have an unequal number of fingers.

8. The filter of claim 2 wherein the inserted reflectors are spaced by equal gaps.

9. The filter of claim 2 wherein the inserted reflectors have equal pitches.

10. The filter of claim 1 in which first, second, and third interdigital transducers are situated within the filter cavity, the first and second transducers are spaced by a first gap, the second and third transducers are spaced by a second gap, a first number of reflectors are inserted in the first gap, and the same number of reflectors are inserted in the second gap, the number of reflectors being equal to or greater than one.

11. The filter of claim 10 wherein the number of reflectors inserted in each gap is equal to the number of desired poles minus three.

12. A filter system comprising the filter of claim 1 terminated in input and output impedances.

13. The filter of claim 1 wherein the first and second reflectors, the interdigital transducers, and the inserted reflectors are composed of metal elements deposited on a piezoelectric substrate.

14. The filter of claim 1 wherein one or more of the following parameters are configured to control frequency response shape: number of fingers of any of the filter reflectors; pitch of any of the filter reflectors; number of fingers of any of the filter interdigital transducers; pitch of any of the filter interdigital transducers; and spacing between any two adjacent filter elements.

15. A surface-wave acoustic filter comprising:

first and second reflectors defining a filter cavity;

first, second, and third interdigital transducers within the cavity, the first and second interdigital transducers spaced by a first gap, and the second and third interdigital transducers spaced by a second gap, and an identical number of reflectors inserted in the two gaps, the number being greater than or equal to one, the inserted reflectors configured to increase the number of poles in the resultant frequency response by the identical number of inserted reflectors, and thereby increase the frequency selectivity of the filter.

16. The filter of claim 15 configured to exhibit mirror image symmetry.

17. The filter of claim 16 wherein the number of reflectors in each gap equals the number of desired poles minus three.

18. Plurality of cascaded filters as claimed in claim 1.

19. The filter of claim 2 wherein the number of reflectors inserted in the gap is equal to the number of desired poles minus two.

20. The filter of claim 10 wherein the number of reflectors inserted in each gap is equal to the number of desired poles minus two.

* * * * *